United States Patent
Jones

(10) Patent No.: US 10,979,210 B1
(45) Date of Patent: Apr. 13, 2021

(54) SYNCHRONIZATION HEADERS FOR SERIAL DATA TRANSMISSION WITH MULTI-LEVEL SIGNALING

(71) Applicant: Xilinx, Inc., San Jose, CA (US)

(72) Inventor: Ben J. Jones, Edinburgh (GB)

(73) Assignee: XILINX, INC., San Jose, CA (US)

(*) Notice: Subject to any disclaimer, the term of this patent is extended or adjusted under 35 U.S.C. 154(b) by 158 days.

(21) Appl. No.: 16/273,884

(22) Filed: Feb. 12, 2019

(51) Int. Cl.
*H04L 7/04* (2006.01)
*H04L 27/156* (2006.01)
*H04L 27/34* (2006.01)
*H03M 7/16* (2006.01)

(52) U.S. Cl.
CPC .............. *H04L 7/041* (2013.01); *H03M 7/16* (2013.01); *H04L 27/1563* (2013.01); *H04L 27/3488* (2013.01)

(58) Field of Classification Search
CPC . H04L 7/041; H04L 27/1563; H04L 27/3488; H03M 7/16
See application file for complete search history.

(56) References Cited

U.S. PATENT DOCUMENTS

2007/0157060 A1* 7/2007 Ganga ............... H03M 13/6312
714/752
2010/0070823 A1* 3/2010 Geng .................... H04L 1/0057
714/752

* cited by examiner

*Primary Examiner* — Luat Phung
(74) *Attorney, Agent, or Firm* — Patterson + Sheridan, LLP

(57) ABSTRACT

Techniques for handling synchronization headers for serial data transmission with multi-level signaling are described. In an example, a transmitter includes a multiplexer circuit configured to serialize an input signal to generate an output bit sequence having a plurality of bits between pairs of synchronization header bits. The transmitter includes a re-ordering circuit, coupled to the multiplexer circuit to receive the output bit sequence, configured to re-order the output bit sequence by moving at least one of the plurality of bits between the synchronization header bits in each of the pairs of synchronization header bits. The transmitter includes an output driver circuit configured to drive the re-ordered output bit sequence onto a transmission medium.

20 Claims, 6 Drawing Sheets

SYNCHRONIZATION HEADERS FOR SERIAL DATA TRANSMISSION WITH MULTI-LEVEL SIGNALING

TECHNICAL FIELD

Examples of the present disclosure generally relate to electronic circuits and, in particular, to synchronization headers for serial data transmission with multi-level signaling.

BACKGROUND

Serial data transmission protocols, such as Ethernet and Peripheral Component Interconnect (PCI) Express, make use of framing bits to encapsulate data at the physical coding sublayer (PCS). In particular, a two-bit header is often used, where the value 01 denotes a data word and the value 10 a control word, with 00 and 11 reserved for error conditions. In a system that uses bipolar or non-return to zero (NRZ) sianaling (i.e., systems that represent 0 and 1 by voltages +1 and −1), inserting such headers periodically ensure that the transmitted data has regular transitions to aid dock recovery at the receiver. By using values 01 and 10, the DC balance of the link is also preserved. This forms the basis of 66b/64b and 130b/128b encoding schemes.

If the transmission medium uses a higher-order modulation scheme instead of NRZ, the synchronization header as described above may not fulfill its stated purpose. For example, high-end serial transceivers are moving towards pulse amplitude modulation (PAM) signaling, which for example uses four levels (e.g., PAM41 rather than two levels. This means that two bits are encoded to one transmitted symbol, and the 01 or 10 pattern will occupy a single symbol (if aligned) or else one bit each of two adjacent symbols (if not aligned). Assuming the framed data is random in nature, it is clear that the probability of a transition occurring in this case is reduced to 75%. Moreover, if Gray code mapping of the transmitted data is used, the DC balance of the link is upset because the voltage transmitted for the symbol 01 is not the negative of that transmitted for 10.

SUMMARY

Techniques for handling synchronization headers for serial data transmission with multi-level signaling are described. In an example, a transmitter includes: a multiplexer circuit configured to serialize an input signal to generate an output bit sequence having a plurality of bits between pairs of synchronization header bits; a re-ordering circuit, coupled to the multiplexer circuit to receive the output bit sequence, configured to re-order the output bit sequence by moving at least one of the plurality of bits between the synchronization header bits in each of the pairs of synchronization header bits; and an output driver circuit configured to drive the re-ordered output bit sequence onto a transmission medium.

In another example, a communication system includes a transmitter; and a receiver coupled to the transmitter over a transmission medium. The transmitter includes: a multiplexer circuit configured to serialize an input signal to generate an output bit sequence having a plurality of bits between pairs of synchronization header bits; a re-ordering circuit, coupled to the multiplexer circuit to receive the output bit sequence, configured to re-order the output bit sequence by moving at least one of the plurality of bits between the synchronization header bits in each of the pairs of synchronization header bits; and an output driver circuit configured to drive the re-ordered output bit sequence onto a transmission medium.

In another example, a method of transmitting a bit sequence from a transmitter to a receiver includes: controlling a multiplexer circuit in the transmitter to serialize an input signal to generate an output bit sequence having a plurality of bits between pairs of synchronization header bits; controlling a re-ordering circuit, coupled to the multiplexer circuit to receive the output bit sequence, to re-order the output bit sequence by moving at least one of the plurality of bits between the synchronization header bits in each of the pairs of synchronization header bits; and controlling an output driver circuit to drive the re-ordered output bit sequence onto a transmission medium.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
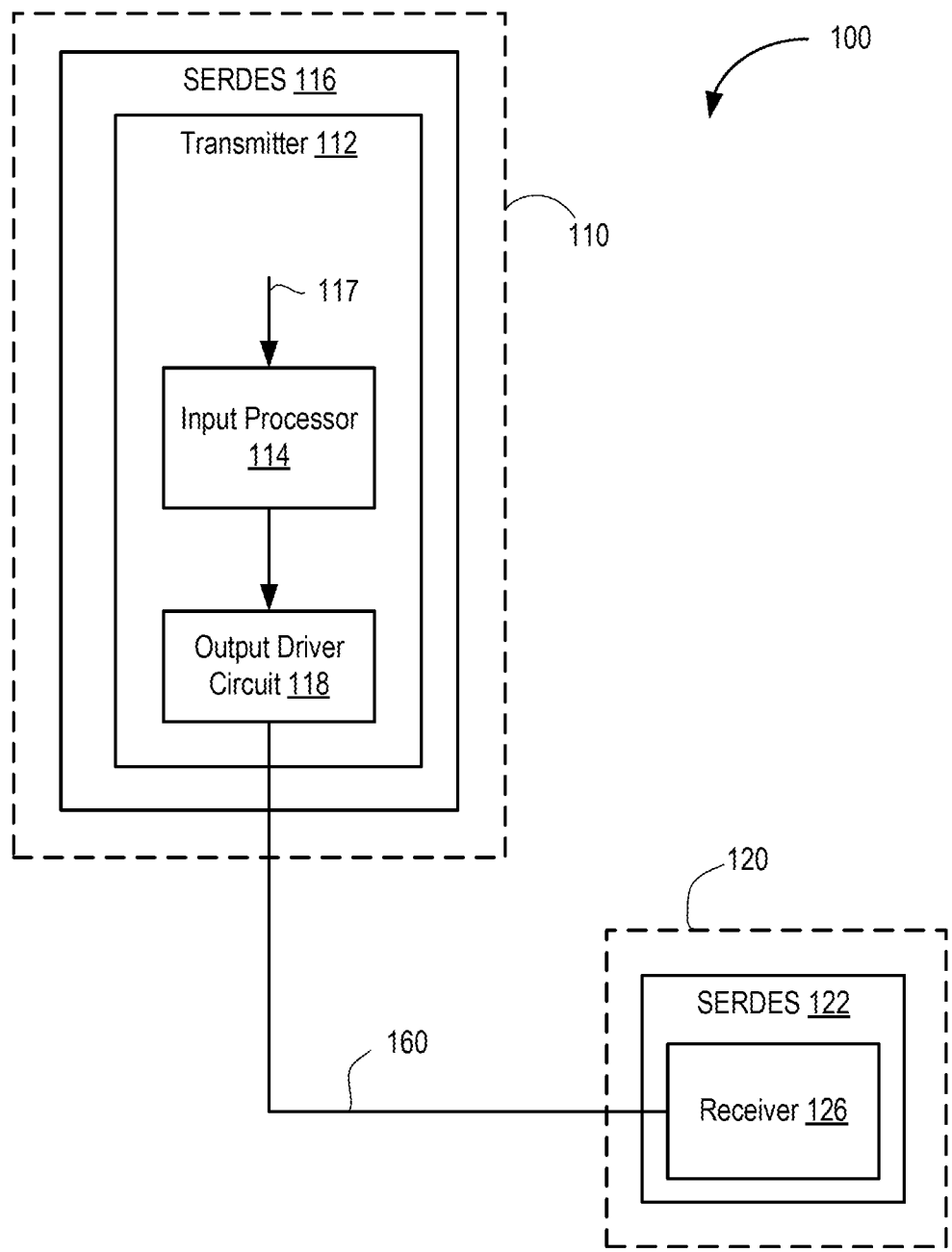
FIG. 1 is a block diagram depicting an example of a serial communication system.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SerDes) 116. The receiver 126 can be part of a SerDes 125. The transmission medium 160 comprises an electrical path between the transmitter 112 and the receiver 126 and can include printed circuit board (PCB) traces, vias, cables, connectors, decoupling capacitors, and the like. Alternatively, the transmission medium 160 can include an optical path between the transmitter 112 and the receiver 126. The receiver of the SerDes 116, and the transmitter of the SerDes 125, are omitted for clarity. In some examples, the SerDes 116 can be disposed in an integrated circuit (IC) 110, and the SerDes 125 can be disposed in an IC 120.

The transmitter 112 drives serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In examples, the transmitter 112 uses multi-level digital baseband modulation techniques, such as pulse amplitude modulation (PAM), where a symbol includes a plurality of bits of the serial data and more than two analog voltages are used to represent each bit. For example, the transmitter 112 can use PAM4 modulation, which uses four levels to transmit each symbol, where each symbol represents two bits to be transmitted. In other examples, higher order PAM modulation schemes can be used (e.g., PAM8 that uses eight voltage levels to transmit each symbol).

The transmitter 112 includes an input processor 114 and an output driver circuit 118. In the example, the input processor 114 receives an input signal 117 and outputs a bit sequence to be transmitted based on the selected modulation scheme. The output driver circuit 118 drives the bit sequence as an analog signal on the transmission medium 160 (e.g., a differential signal). The receiver 126 includes conventional components for receiving, equalizing, de-serializing, etc. of the transmitted signal. In general, the input processor 114 includes circuitry configured to serialize the input signal 117, re-order bits in the bit sequence, and optionally performing Gray coding, as described further below.

Figure 2:
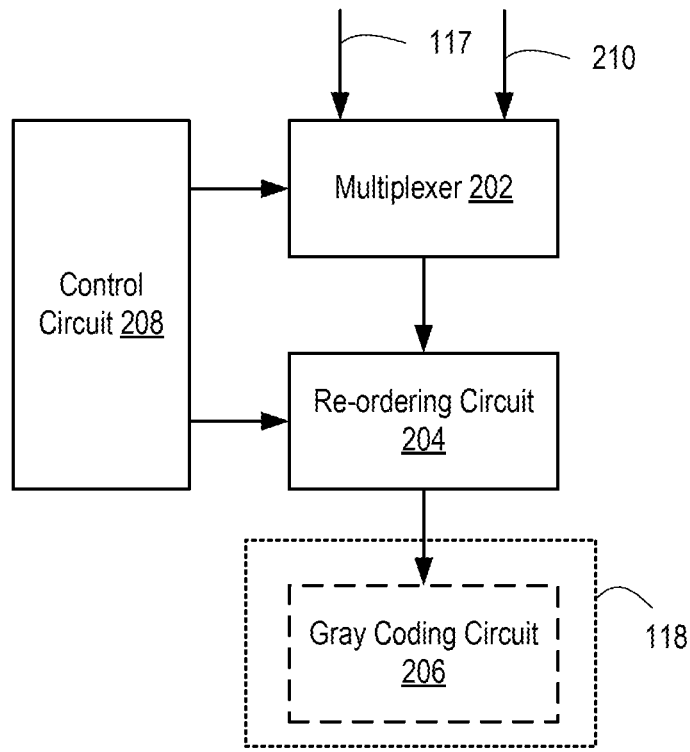
FIG. 2 is a block diagram depicting an input processor in a transmitter according to an example.

FIG. 2 is a block diagram depicting the input processor 114 according to an example. In an example, the input processor 114 includes a multiplexer 202, a re-ordering circuit 204, and a control circuit 208. In other examples, the input processor 114 includes the multiplexer 202, the re-ordering circuit 204, the control circuit 208, and a Gray coding circuit 206.

The multiplexer circuit 202 is configured to serialize the input signal 117 to generate an output bit sequence having a plurality of bits between pairs of synchronization header bits. The input signal 117 can be any type of digital input data to be transmitted (e.g., a sequence of N-bit data words, where N is a positive integer). The multiplexer circuit 202 receives control signal(s) from the control circuit 208, such as a clocking signal, a selection signal, or the like. The multiplexer 202 also receives a header synchronization signal 210. The header synchronization signal 210 provides synchronization header bits to be inserted into the bit sequence output by the multiplexer 202. In an example, the header synchronization signal 210 provides a two-bit header such as that used in Ethernet or PCI Express, which is periodically inserted into the bitstream to be transmitted for framing and encapsulating data bits. Example synchronization header bits include 01 and 10.

Figure 3:
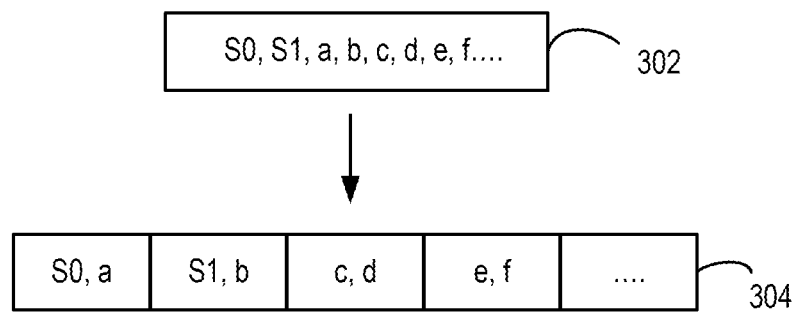
FIG. 3 is a block diagram depicting a bit sequence to be transmitted and a re-ordered bit sequence to be transmitter according to an example.

For example, consider bits to be transmitted as [a, b, c, d, e, f . . . ], and synchronization header bits S0 and S1. The multiplexer circuit 202 can select from the input signal 117 and the header synchronization signal 210 in response to control signal(s) from the control circuit 208 to output a bit sequence [S0, S1, a, b, c, d, e, f . . . ]. FIG. 3 is a block diagram depicting a bit sequence 302 to be transmitted in the example, which includes S0, S1, a, b, c, d, e, f. In a non-return to zero (NRZ) system, the bit sequence [S0, S1, a, b, c, d, e, f . . . ] is the transmission order. However, in a multi-level modulation system such as PAM4, a transition at the header position is no longer guaranteed, as discussed above.

Furthermore, in some examples, the Gray coding circuit 206 is employed to provide Gray coding. In case of Gray coding and/or if there is a long-term disparity between the likelihood of 01 and 10 values for [S0, S1], the channel will exhibit baseline wander (e.g., drift away from DC balance). Gray coding is typically used in practice to ensure that all symbol errors caused by mistaking two adjacent voltage levels result in only a single bit error, thus minimizing the bit error rate for a given symbol error rate.

In an example, the re-ordering circuit 204 receives the bit sequence from the multiplexer circuit 202. The re-ordering circuit 204 is configured to re-order the output bit sequence by moving at least one of the data bits between synchronization header bits in each of the pairs of synchronization header bits. The number of data bits inserted between the synchronization header bits in each pair thereof depends on the multi-level modulation scheme employed. In a PAM4 system, for example, the re-ordering circuit 204 inserts one data bit between synchronization header bits in each pair thereof. Thus, in the example bit sequence above, the re-ordering circuit 204 receives the bit sequence [S0, S1, a, b, c, d, e, f . . . ] and outputs [S0, a, S1, b, c, d, e, f . . . ], where the data bit [a] is inserted between synchronization header bits S0 and S1 in the pair [S0, S1]. This is shown in FIG. 3, as a bit sequence 304, which includes bit pars [S0,a], [S1,b], [c,d], [e,f] . . . . The re-ordering circuit 204 performs the re-ordering operation before Gray coding is applied (if Gray coding is employed).

Consider a PAM4 signal where 00 is transmitted as −3, 01 is transmitted as −1, 11 is transmitted as +1, and 10 is transmitted as +3. Assume first that S0 and S1 are the most significant bit (MSB) of each PAM4 symbol. When S0=0 and S1=1, the first symbol transmitted [S0,a] must be either 01 or 00, which is −3 or −1. The second symbol transmitted [S1, b] must be either 11 or 10, which is +1 or +3. Therefore, a transition is guaranteed and furthermore the transition will always cross the signal average. It can also be seen that if a and b are uniformly random, then the DC balance of the signal has been restored. For a 01 header, the transitions [−1, +1], [−1, +3], [−3, +1], and [−3, +3] are all equally likely. The same is true with signs reversed for a 10 header. So the relative likelihood of the header values also has no effect on the DC balance in the present re-ordering scheme.

In the presence of Gaussian noise, an error in the MSB of a PAM4 symbol is half as likely as an error in the least significant bit (LSB). Since synchronization headers determine how the data payload is interpreted by the higher layers, this additional robustness may well be desired. The present re-ordering scheme provides the additional robustness for free if the S0 and S1 bits are inserted as the MSBs.

If the alignment of bits to symbols is shifted such that bits S0 and S1 are the LSB of the PAM4 symbol, and bits a and b the MSB, a transition is still guaranteed, but it may not be average-crossing. Also, the additional protection afforded to the synchronization header is negated in this case.

The procedure can be generalized to higher-order modulation schemes by increasing the distance between S0 and S1. For example, in a PAM8 modulation scheme, the bit sequence [S0, S1, a, b, c, d, e, f . . . ] is output as [S0, a, b, S1, c, d, e, f . . . ], where the data bits [a, b] are inserted between synchronization header bits S0 and S1 in the pair [S0, S1]. In general, for a PAM2^K modulation scheme, the re-ordering circuit 204 inserts K−1 data bits between synchronization header bits in each pair thereof.

Figure 4:
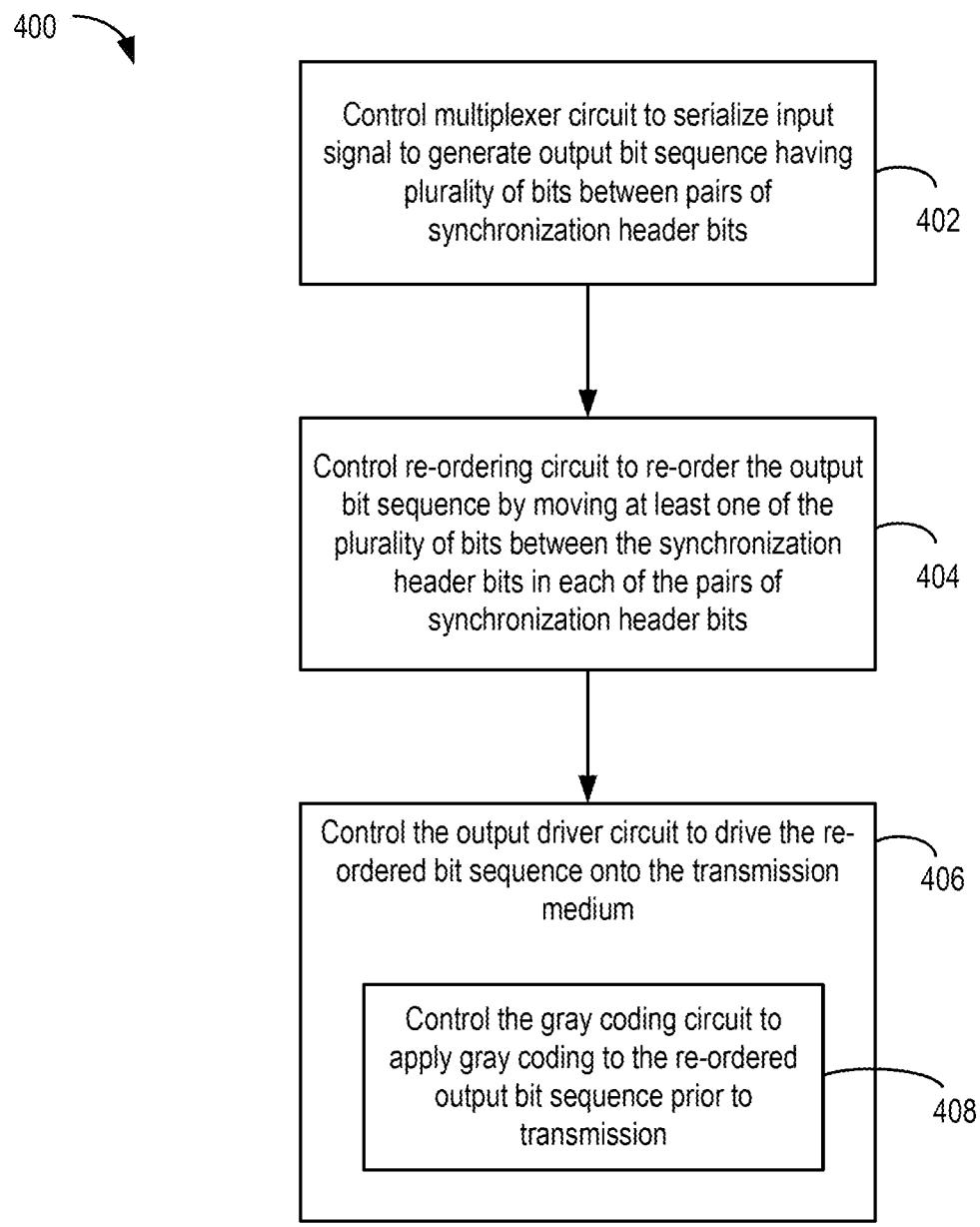
FIG. 4 is a flow diagram depicting a method of transmitting a bit sequence from a transmitter to a receiver according to an example.

FIG. 4 is a flow diagram depicting a method 400 of transmitting a bit sequence from a transmitter to a receiver according to an example. The method 400 begins at step 402, where the control circuit 208 controls the multiplexer 202 to serialize an input signal to generate an output bit sequence having a plurality of bits between pairs of synchronization header bits. In the example described above, the multiplexer 202 serializes the input signal 117 and the header synchronization signal 210 to generate a multiplexed bit sequence of data bits between pairs of header synchronization bits.

At step 404, the control circuit 208 controls the re-ordering circuit 204 to re-order the output bit sequence by moving at least one of the plurality of bits between the synchronization header bits in each of the pairs of synchronization header bits. As described above, the number of data bits inserted between synchronization header bits depends on the modulation scheme employed by the transmitter. In an example, the transmitter employs a multi-level digital baseband modulation scheme, such as PAM. In a specific example, the transmitter employs a 4-level PAM scheme (PAM4). In such case, the re-ordering circuit is configured to move only one of the plurality of bits between the synchronization header bits in each of the pairs of synchronization header bits. In another example, the transmitter employs an N-level PAM (PAM-N) scheme, where N=2K. In such case, the re-ordering circuit is configured to move K−1 of the plurality of bits between the synchronization header bits in each of the pairs of synchronization header bits.

At step 406, the output driver circuit 118 drives the re-ordered bit sequence onto the transmission medium. In an example, the output driver circuit includes a Gray coding circuit 206. In such case, at step 408, the Gray coding circuit 206 applies Gray coding to the re-ordered bit sequence prior to transmission of the bit sequence.

Figure 5:
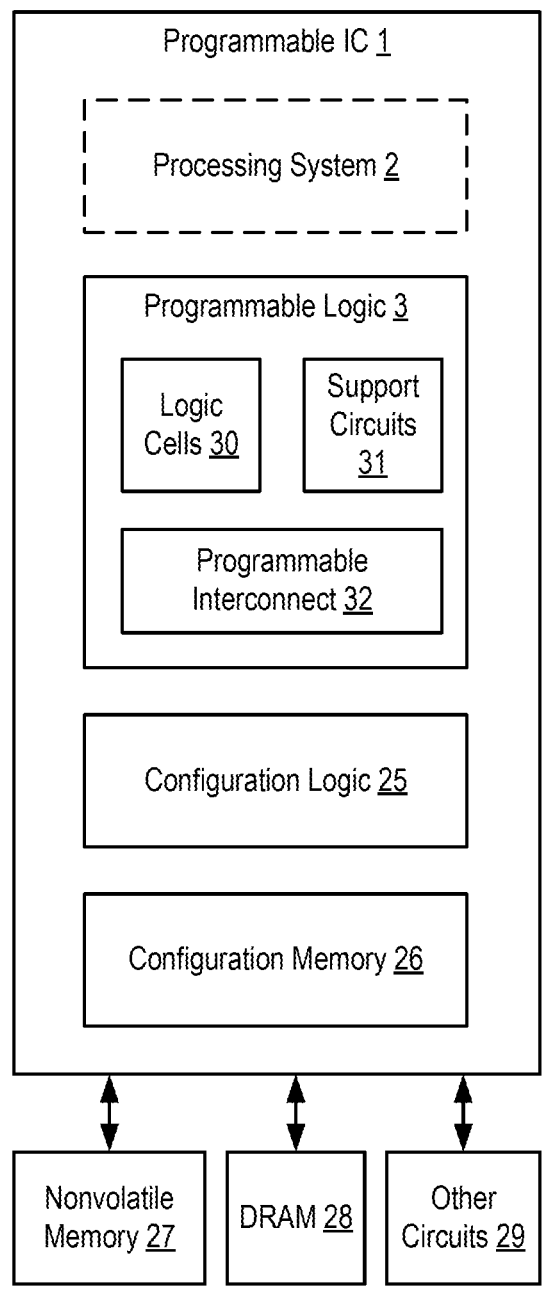
FIG. 5 is a block diagram depicting a programmable integrated circuit (IC) according to an example in which the transmitter described herein can be used.

FIG. 5 is a block diagram depicting a programmable IC 1 according to an example in which the transmitter 112 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 6:
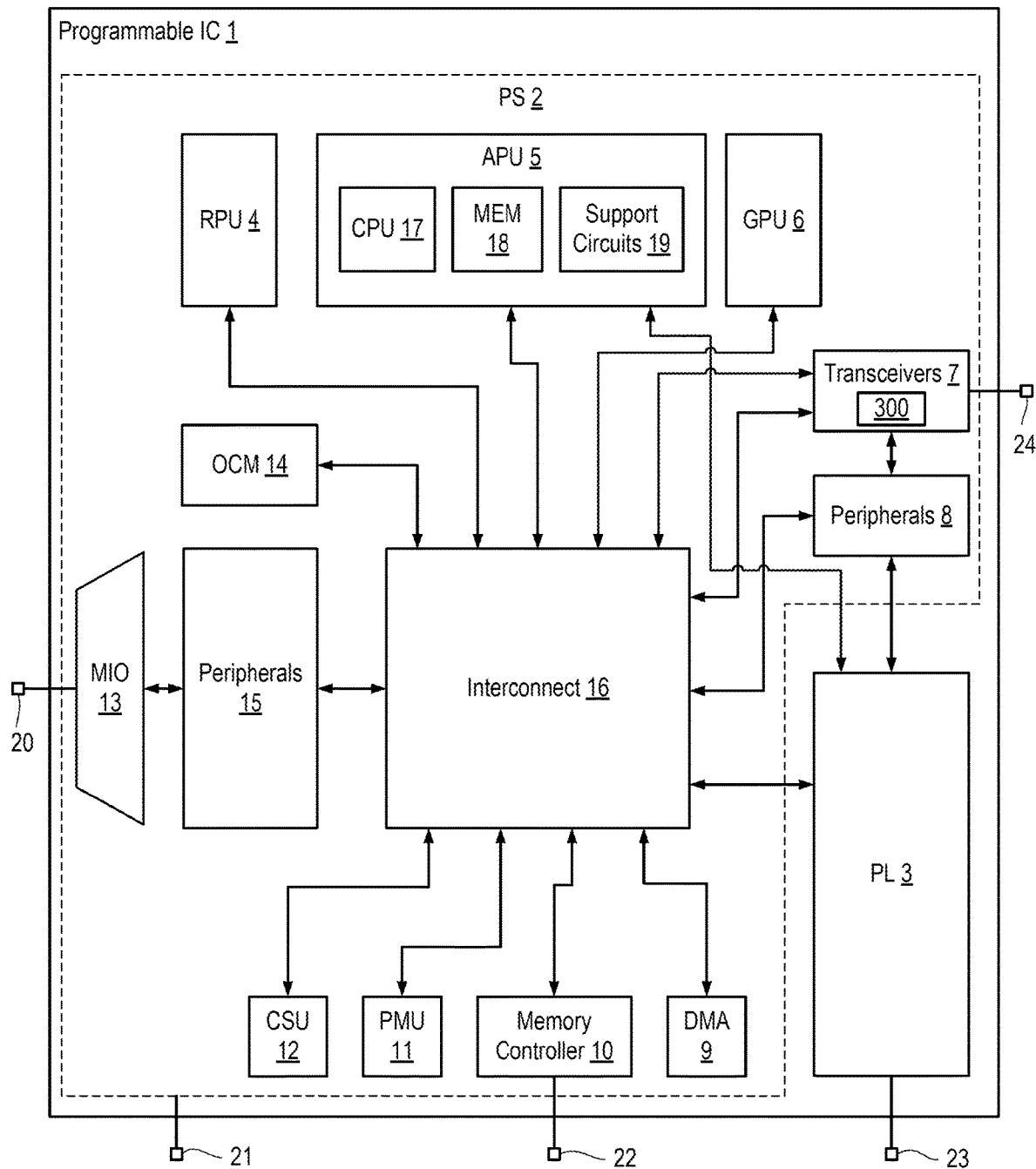
FIG. 6 is a block diagram depicting a System-on-Chip (SoC) implementation of a programmable IC according to an example in which the transmitter described herein can be used.

FIG. 6 is a block diagram depicting a System-on-Chip (SoC) implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 122, and the like. The processing system 2 also includes various support circuits, such as on-chip memory (OCM) 14, transceivers 7, peripherals 8, interconnect 16, DMA circuit 9, memory controller 10, peripherals 15, and multiplexed 10 (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 15 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose IO (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SERDES) circuits, MGTs, and the like.

Figure 7:
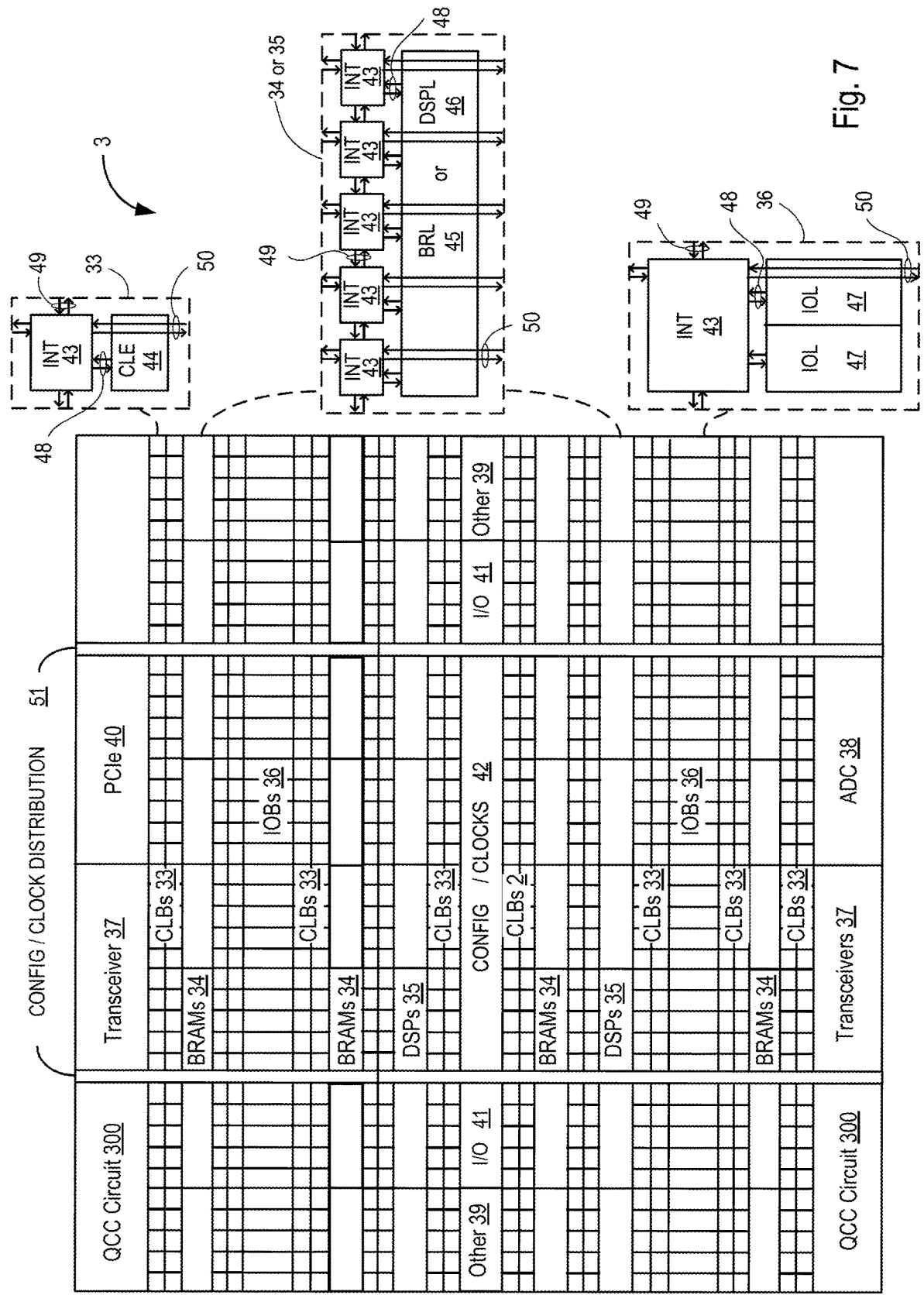
FIG. 7 illustrates a field programmable gate array (FPGA) implementation of a programmable IC in which the transmitter described herein can be used.

FIG. 7 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

In some FPGAs, each programmable tile can include at least one programmable interconnect element ("INT") 43 having connections to input and output terminals 48 of a programmable logic element within the same tile, as shown by examples included at the top of FIG. 7. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 10) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A transmitter, comprising:
    a multiplexer circuit configured to serialize an input signal to generate an output bit sequence having a plurality of bits between pairs of synchronization header bits;
    a re-ordering circuit coupled to the multiplexer circuit to receive the output bit sequence, and configured to re-order the output bit sequence by moving at least one of the plurality of bits between the synchronization header bits in each of the pairs of synchronization header bits; and
    an output driver circuit configured to drive the re-ordered output bit sequence onto a transmission medium.

2. The transmitter of claim 1, further comprising:
    a Gray coding circuit coupled to receive the re-ordered output bit sequence from the re-ordering circuit, and configured to apply Gray coding to the re-ordered output bit sequence prior to transmission by the output driver circuit.

3. The transmitter of claim 1, wherein the output driver circuit is configured to drive the re-ordered output bit sequence onto the transmission medium using a multi-level digital baseband modulation scheme.

4. The transmitter of claim 3, wherein the multi-level digital baseband modulation scheme is a pulse amplitude modulation (PAM) scheme.

5. The transmitter of claim 4, wherein the PAM scheme is a 4-level PAM (PAM4) scheme, and wherein the re-ordering circuit is configured to move only one of the plurality of bits between the synchronization header bits in each of the pairs of the synchronization header bits.

6. The transmitter of claim 4, wherein the PAM scheme is an N-level PAM (PAM-N) scheme, where N=2K and wherein the re-ordering circuit is configured to move K−1 of the plurality of bits between the synchronization header bits in each of the pairs of synchronization header bits.

7. The transmitter of claim 1, further comprising:
    a control circuit configured to control the multiplexer circuit to select from the input signal and a header synchronization signal having synchronization header bits to output the output bit sequence, and configured to control the re-ordering circuit to generate the re-ordered output bit sequence based on a selected modulation scheme.

8. A communication system, comprising:
    a transmitter; and
    a receiver coupled to the transmitter over a transmission medium;
    wherein the transmitter includes:
        a multiplexer circuit configured to serialize an input signal to generate an output bit sequence having a plurality of bits between pairs of synchronization header bits;
        a re-ordering circuit coupled to the multiplexer circuit to receive the output bit sequence, and configured to re-order the output bit sequence by moving at least one of the plurality of bits between the synchronization header bits in each of the pairs of synchronization header bits; and
        an output driver circuit configured to drive the re-ordered output bit sequence onto the transmission medium.

9. The communication system of claim 8, wherein the transmitter further comprises:
a Gray coding circuit coupled to receive the re-ordered output bit sequence from the re-ordering circuit, and configured to apply Gray coding to the re-ordered output bit sequence prior to transmission by the output driver circuit.

10. The communication system of claim 8, wherein the output driver circuit is configured to drive the re-ordered output bit sequence onto the transmission medium using a multi-level digital baseband modulation scheme.

11. The communication system of claim 10, wherein the multi-level digital baseband modulation scheme is a pulse amplitude modulation (PAM) scheme.

12. The communication system of claim 11, wherein the PAM scheme is a 4-level PAM (PAM4) scheme, and wherein the re-ordering circuit is configured to move only one of the plurality of bits between the synchronization header bits in each of the pairs of the synchronization header bits.

13. The communication system of claim 11, wherein the PAM scheme is an N-level PAM (PAM-N) scheme, and wherein the re-ordering circuit is configured to move N−1 of the plurality of bits between the synchronization header bits in each of the pairs of synchronization header bits.

14. The communication system of claim 8, wherein the transmitter further comprises:
a control circuit configured to control the multiplexer circuit to select from the input signal and a header synchronization signal having synchronization header bits to output the output bit sequence, and configured to control the re-ordering circuit to generate the re-ordered output bit sequence based on a selected modulation scheme.

15. A method of transmitting a bit sequence from a transmitter to a receiver, comprising:
controlling a multiplexer circuit in the transmitter to serialize an input signal to generate an output bit sequence having a plurality of bits between pairs of synchronization header bits;
controlling a re-ordering circuit, coupled to the multiplexer circuit to receive the output bit sequence, to re-order the output bit sequence by moving at least one of the plurality of bits between the synchronization header bits in each of the pairs of synchronization header bits; and
controlling an output driver circuit to drive the re-ordered output bit sequence onto a transmission medium.

16. The method of claim 15, further comprising:
controlling a Gray coding circuit, coupled to receive the re-ordered output bit sequence from the re-ordering circuit, to apply Gray coding to the re-ordered output bit sequence prior to transmission by the output driver circuit.

17. The method of claim 15, wherein the output driver circuit is configured to drive the re-ordered output bit sequence onto the transmission medium using a multi-level digital baseband modulation scheme.

18. The method of claim 17, wherein the multi-level digital baseband modulation scheme is a pulse amplitude modulation (PAM) scheme.

19. The method of claim 18, wherein the PAM scheme is a 4-level PAM (PAM4) scheme, and wherein the re-ordering circuit is configured to move only one of the plurality of bits between the synchronization header bits in each of the pairs of the synchronization header bits.

20. The method of claim 18, wherein the PAM scheme is an N-level PAM (PAM-N) scheme, where N=2K and wherein the re-ordering circuit is configured to move K−1 of the plurality of bits between the synchronization header bits in each of the pairs of synchronization header bits.

* * * * *